(12) United States Patent
Kiuchi et al.

(10) Patent No.: US 8,963,322 B2
(45) Date of Patent: Feb. 24, 2015

(54) ELECTRIC POWER CONVERSION APPARATUS

(71) Applicant: Denso Corporation, Kariya, Aichi-pref. (JP)

(72) Inventors: Yuuya Kiuchi, Tokai (JP); Akira Nakasaka, Kariya (JP)

(73) Assignee: Denso Corporation, Kariya (JP)

(*) Notice: Subject to any disclaimer, the term of this patent is extended or adjusted under 35 U.S.C. 154(b) by 0 days.

(21) Appl. No.: 14/224,741

(22) Filed: Mar. 25, 2014

(65) Prior Publication Data

US 2014/0284765 A1    Sep. 25, 2014

(30) Foreign Application Priority Data

Mar. 25, 2013 (JP) ................. 2013-061467

(51) Int. Cl.
| | |
|---|---|
| *H01L 23/34* | (2006.01) |
| *H01L 49/02* | (2006.01) |
| *H05K 7/14* | (2006.01) |
| *H01L 23/40* | (2006.01) |
| *H01L 23/473* | (2006.01) |
| *H02M 7/537* | (2006.01) |

(52) U.S. Cl.
CPC .............. *H01L 28/40* (2013.01); *H05K 7/1427* (2013.01); *H01L 23/4012* (2013.01); *H01L 23/473* (2013.01); *H02M 7/537* (2013.01)
USPC ........... 257/712; 257/686; 257/724; 361/688; 361/715; 361/763; 361/831

(58) Field of Classification Search
CPC .................................................. H05K 7/1427

USPC .......... 257/686, 712, 724; 361/688, 715, 763, 361/831
See application file for complete search history.

(56) References Cited

U.S. PATENT DOCUMENTS

| 8,665,623 B2 * | 3/2014 | Suzuki et al. ................. 363/141 |
|---|---|---|
| 2011/0194246 A1 | 8/2011 | Nakasaka et al. |
| 2011/0194247 A1 | 8/2011 | Nakasaka et al. |
| 2011/0194248 A1 | 8/2011 | Nakasaka et al. |
| 2011/0194249 A1 | 8/2011 | Nakasaka et al. |
| 2011/0194322 A1 | 8/2011 | Nakasaka et al. |

FOREIGN PATENT DOCUMENTS

| JP | 2011-182626 | 9/2011 |
|---|---|---|
| JP | 2012-217322 | 11/2012 |

* cited by examiner

*Primary Examiner* — Nicholas Tobergte
(74) *Attorney, Agent, or Firm* — Nixon & Vanderhye P.C.

(57) ABSTRACT

An electric power conversion apparatus includes a stacked body, a capacitor, a metal frame and a case. The stacked body is formed by stacking semiconductor modules with coolant passages formed therebetween. The frame has both the stacked body and the capacitor fixed therein. The case has all of the stacked body, the capacitor and the frame received therein. Further, the frame has a separation wall that separates the stacked body and the capacitor from each other, a stacked body-surrounding wall that surrounds the stacked body with the help of the separation wall, and a capacitor-surrounding that surrounds the capacitor with the help of the separation wall. The capacitor has a pair of end portions that are opposite to each other in a predetermined direction, in which control terminals of the semiconductor modules of the stacked body protrude, and each at least partially exposed from the capacitor-surrounding wall of the frame.

6 Claims, 10 Drawing Sheets

ELECTRIC POWER CONVERSION APPARATUS

CROSS-REFERENCE TO RELATED APPLICATION

This application is based on and claims priority from Japanese Patent Application No. 2013-61467 filed on Mar. 25, 2013, the content of which is hereby incorporated by reference in its entirety into this application.

BACKGROUND

1. Technical Field

The present invention relates to an electric power conversion apparatus that includes a stacked body, a capacitor and a metal frame; the stacked body is formed by stacking a plurality of semiconductor modules and has a plurality of coolant passages formed between the semiconductor modules.

2. Description of the Related Art

There is disclosed, for example in Japanese Unexamined Patent Application Publication No. 2011-182626, an electric power conversion apparatus that performs electric power conversion between DC (Direct Current) power and AC (Alternating Current) power.

Specifically, the electric power conversion apparatus is configured to include a stacked body, a metal frame, a capacitor and a case. The stacked body is formed by stacking a plurality of semiconductor modules, each of which has semiconductor elements built therein, and a plurality of cooling devices for cooling the semiconductor modules. The frame has the stacked body arranged and fixed therein. The capacitor is located outside of the frame and configured to smooth DC voltage applied to the semiconductor modules. The case receives all of the stacked body, the frame and the capacitor therein. In addition, the case is fixed at a suitable position in, for example, a hybrid vehicle or an electric vehicle.

However, with the above configuration, when there are electronic devices arranged in the vicinity of the electric power conversion apparatus, heat generated by the electronic devices will be transmitted to the capacitor via the case, thereby increasing the temperature of the capacitor. Further, the increase in the temperature of the capacitor will shorten the service life of the capacitor.

Moreover, since all of the stacked body, the frame and the capacitor are received in the case, it may be difficult to minimize the size of the case. Consequently, it may be difficult to make the entire electric power conversion apparatus compact in size.

SUMMARY

According to an exemplary embodiment, an electric power conversion apparatus is provided which includes a stacked body, a capacitor, a metal frame and a case. The stacked body is formed by stacking a plurality of semiconductor modules and has a plurality of coolant passages formed between the semiconductor modules. Each of the semiconductor modules includes a main body, which has semiconductor elements built therein, and control terminals that protrude from the main body in a predetermined direction. The capacitor is configured to smooth DC voltage applied to the semiconductor modules. The frame has both the stacked body and the capacitor fixed therein. The case has all of the stacked body, the capacitor and the frame received therein. Further, the frame has a separation wall, and a stacked body-surrounding wall and a capacitor-surrounding wall both of which are connected with the separation wall. The separation wall separates the stacked body from the capacitor. The stacked body-surrounding wall surrounds, together with the separation wall, the stacked body so that on a cross section of the electric power conversion apparatus perpendicular to the predetermined direction, in which the control terminals of the semiconductor modules protrude, the stacked body is enclosed by the stacked-body surrounding wall and the separation wall. The capacitor-surrounding wall surrounds, together with the separation wall, the capacitor so that on the cross section of the electric power conversion apparatus perpendicular to the predetermined direction, the capacitor is enclosed by the capacitor-surrounding wall and the separation wall. The capacitor has a pair of end portions that are opposite to each other in the predetermined direction and each at least partially exposed from the capacitor-surrounding wall of the frame.

With the above configuration, the frame has the capacitor-surrounding wall surrounding the capacitor. Consequently, with the capacitor-surrounding wall, it is possible to block external heat which otherwise would be transmitted to the capacitor via the case. As a result, it is possible to suppress increase in the temperature of the capacitor, thereby extending the service life of the capacitor.

Moreover, with the above configuration, the frame also has the stacked body-surrounding wall surrounding the stacked body which has the coolant passages formed therein. Consequently, the metal frame and thus the capacitor-surrounding wall of the frame can be cooled by a coolant that flows through the coolant passages. As a result, with the capacitor-surrounding wall being cooled by the coolant, it is possible to more effectively suppress increase in the temperature of the capacitor, thereby more reliably extending the service life of the capacitor.

Furthermore, with the above configuration, the end portions of the capacitor in the predetermined direction are each at least partially exposed from the capacitor-surrounding wall of the frame. Consequently, it becomes possible to reduce the size of the capacitor-surrounding wall of the frame. As a result, it also becomes possible to reduce the size of the case without causing interference between the capacitor-surrounding wall of the frame and the case.

In addition, with the above configuration, a central portion of the capacitor in the predetermined direction is surrounded by the capacitor-surrounding wall of the metal frame. In general, it is particularly easy for the temperature of the capacitor to be increased at the central portion by heat generated by the capacitor. However, by surrounding the central portion with the capacitor-surrounding wall of the metal frame which can be cooled by the coolant flowing through the coolant passages formed in the stacked body, it is still possible to effectively suppress increase in the temperature of the capacitor.

Accordingly, with the above configuration, it becomes possible to make the electric power conversion apparatus compact in size while effectively suppressing increase in the temperature of the capacitor.

In a further implementation, the case has a frame-surrounding wall that surrounds the frame so that on the cross section of the electric power conversion apparatus perpendicular to the predetermined direction, the frame is enclosed by the frame-surrounding wall. The frame-surrounding wall of the case and the capacitor-surrounding wall of the frame are separated from each other with a first air gap formed therebetween. The capacitor-surrounding wall of the frame and the capacitor are also separated from each other with a second air gap formed therebetween.

The electric power conversion apparatus may further include a pressing member that presses the stacked body in a stacking direction, in which the semiconductor modules are stacked, thereby fixing the stacked body in the frame. In this case, it is preferable that at least part of the capacitor-surrounding wall of the frame has a smaller thickness than a thinnest part of the stacked body-surrounding wall and separation wall of the frame. Further, it is also preferable that the at least part of the capacitor-surrounding wall of the frame has a smaller length in the predetermined direction than a longest part of the stacked body-surrounding wall and separation wall of the frame.

The control terminals of the semiconductor modules may be electrically connected to a control circuit board that is configured to control switching operation of the semiconductor modules.

Further, the control circuit board may be arranged in the case so that the control circuit board and the capacitor overlap each other in the predetermined direction in which the control terminals of the semiconductor modules protrude. In this case, it is preferable that a first clearance provided between the control circuit board and the capacitor in the predetermined direction is greater than a second clearance provided between the control circuit board and the separation wall of the frame in the predetermined direction.

Otherwise, the control circuit board may be arranged in the case without overlapping the capacitor in the predetermined direction in which the control terminals of the semiconductor modules protrude.

BRIEF DESCRIPTION OF THE DRAWINGS

The present invention will be understood more fully from the detailed description given hereinafter and from the accompanying drawings of exemplary embodiments, which, however, should not be taken to limit the invention to the specific embodiments but are for the purpose of explanation and understanding only.

In the accompanying drawings.

DESCRIPTION OF EMBODIMENTS

Exemplary embodiments will be described hereinafter with reference to FIGS. 1-10. It should be noted that for the sake of clarity and understanding, identical components having identical functions throughout the whole description have been marked, where possible, with the same reference numerals in each of the figures and that for the sake of avoiding redundancy, descriptions of the identical components will not be repeated.

[First Embodiment]

Figure 1:
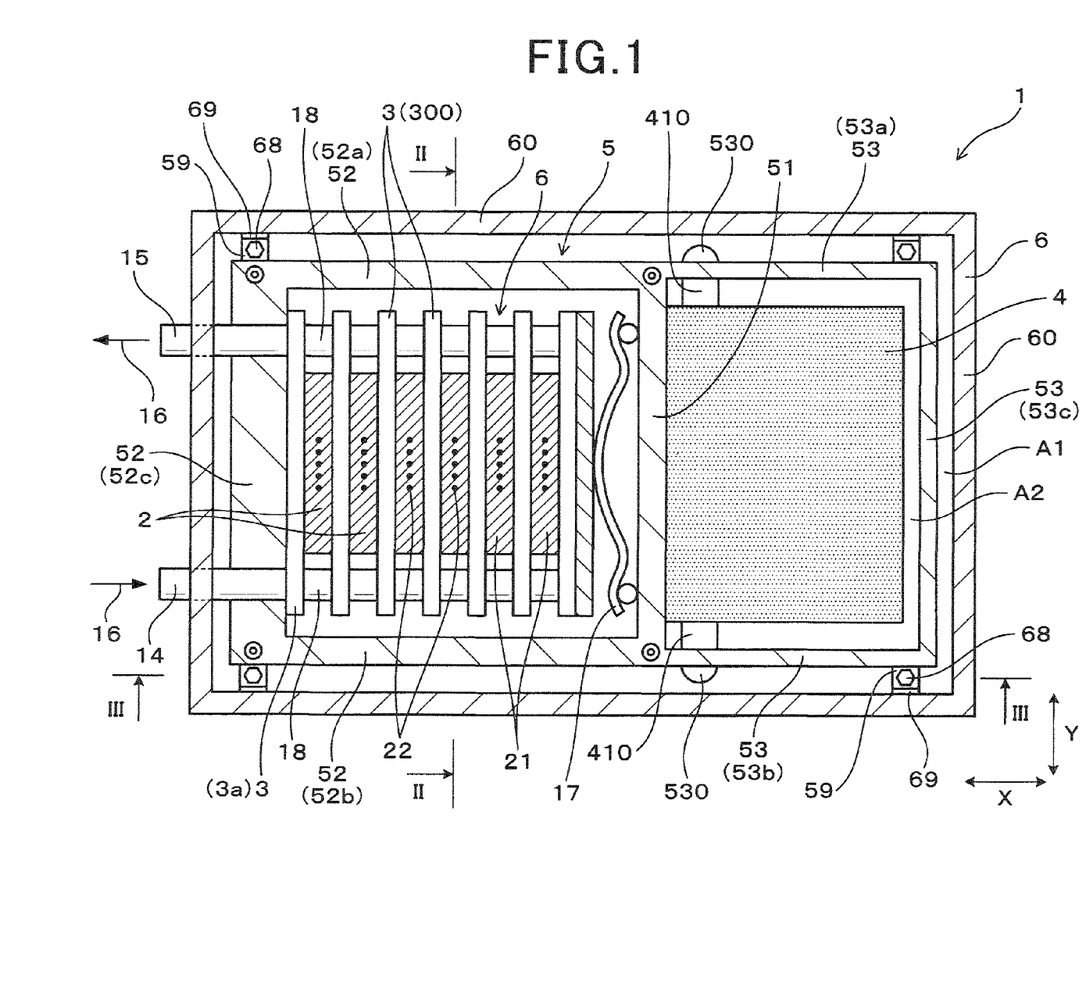
FIG. 1 is a cross-sectional view of an electric power conversion apparatus according to a first embodiment, which is taken along the line I-I in FIG. 2.
Figure 2:
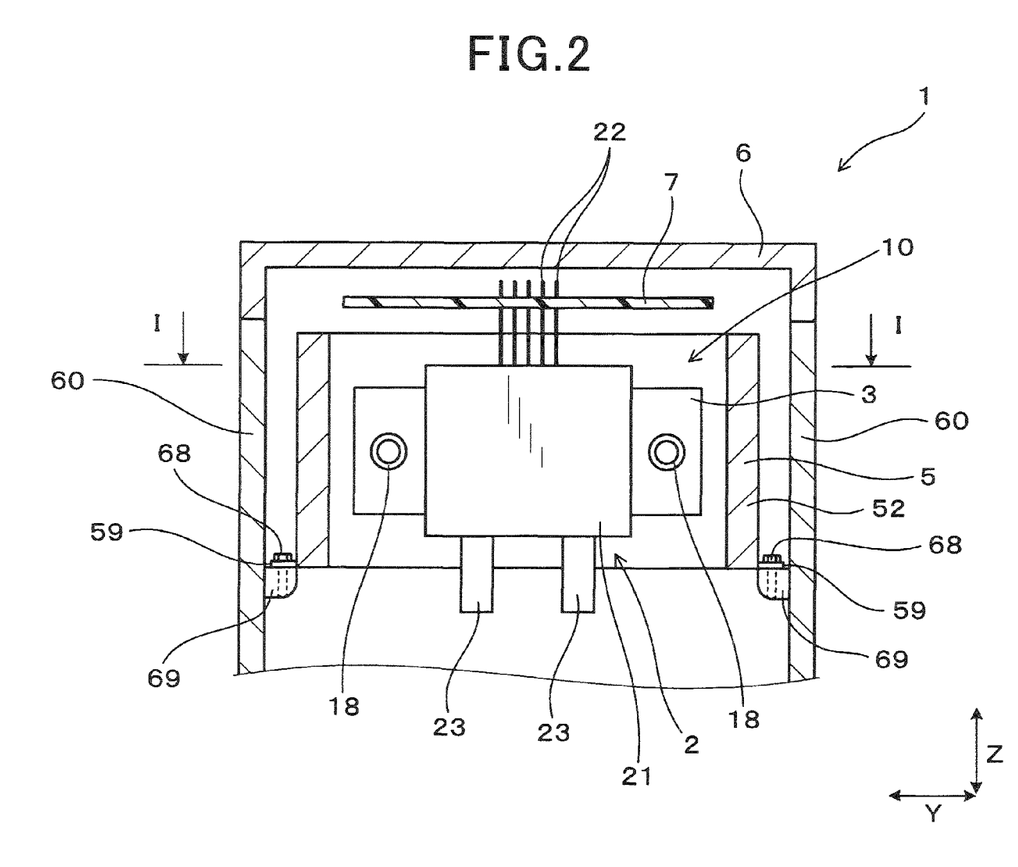
FIG. 2 is a cross-sectional view of the electric power conversion apparatus taken along the line II-II in FIG. 1.
Figure 3:
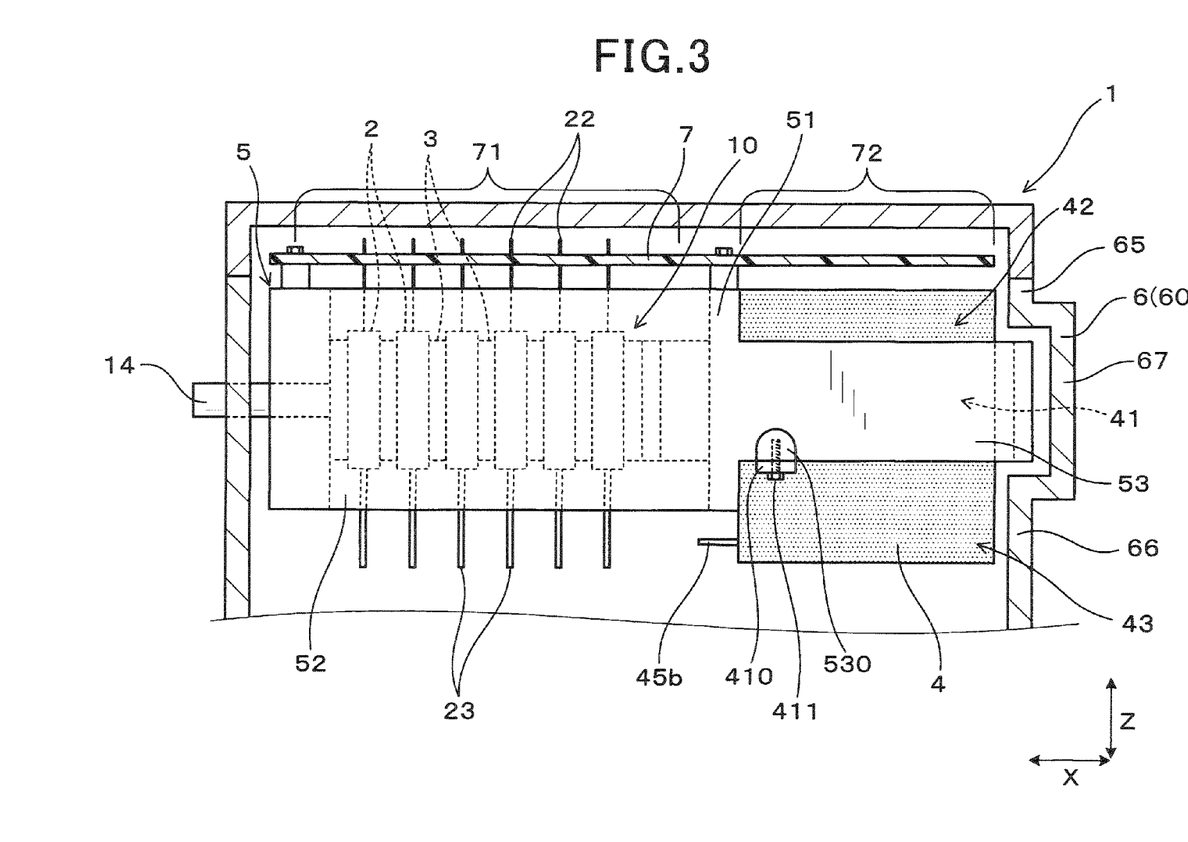
FIG. 3 is a cross-sectional view of the electric power conversion apparatus taken along the line in FIG. 1.

FIGS. 1-3 together show the overall configuration of an electric power conversion apparatus 1 according to a first embodiment.

In the present embodiment, the electric power conversion apparatus 1 is configured as a vehicular electric power conversion apparatus to be used in, for example, an electric vehicle or a hybrid vehicle. Therefore, in the use of the electric power conversion apparatus 1, there are heat-generating devices or machines, such as a motor and an internal combustion engine, around the apparatus 1.

As shown in FIGS. 1-3 the electric power conversion apparatus 1 includes a stacked body 10, a capacitor (or electrical condenser) 4, a metal frame 5 and a case 6.

The stacked body 10 is formed by stacking a plurality of semiconductor modules 2 alternately with a plurality of cooling devices 3 in an X direction as shown in FIGS. 1 and 3. Each of the semiconductor modules 2 includes a main body 21, which has semiconductor elements 20 (shown in FIG. 4) built therein, and a plurality of control terminals 22 that protrude from the main body 21 in a Z direction as shown in FIGS. 2 and 3. The cooling devices 3 are provided to cool the semiconductor modules 2. In addition, as shown in FIG. 3, the protruding direction Z of the control terminals 22 of the semiconductor modules 2 is perpendicular to the stacking direction X of the semiconductor modules 2 and the cooling devices 3.

The capacitor 4 is configured to smooth DC voltage applied to the semiconductor modules 2.

Both the stacked body 10 and the capacitor 4 are fixed in the frame 5. Further, all of the stacked body 10, the capacitor 4 and the frame 5 are together received in the case 6.

In the present embodiment, as best seen from FIG. 1, the frame 5 has a separation wall 51, and a stacked-body surrounding wall 52 and a capacitor-surrounding wall 53 both of which are connected with the separation wall 51. The separation wall 51 separates the stacked body 10 and the capacitor 4, both of which are fixed in the frame 5, from each other. The stacked body-surrounding wall 52 surrounds, together with the separation wall 51, the stacked body 10 so that on a cross section of the electric power conversion apparatus 1 perpendicular to the Z direction (i.e., the protruding direction of the control terminals 22 of the semiconductor modules 2), the stacked body 10 is enclosed by the stacked body-surrounding wall 52 and the separation wall 51. Similarly, the capacitor-surrounding wall 53 surrounds, together with the separation wall 51, the capacitor 4 so that on the cross section of the electric power conversion apparatus 1 perpendicular to the Z direction, the capacitor 4 is enclosed by the capacitor-surrounding wall 53 and the separation wall 51.

Further, in the present embodiment, as shown in FIG. 3, the capacitor-surrounding wall 53 surrounds only a central portion 41 of the capacitor 4 in the Z direction, so that opposite end portions 42 and 43 of the capacitor 4 in the Z direction are both completely exposed from the capacitor-surrounding wall 53.

Moreover, referring to FIG. 1, when viewed along the Z direction, the frame 5 has a substantially rectangular shape. The stacked body-surrounding wall 52 of the frame 5 includes first, second and third parts 52a, 52b and 52c. The first and second parts 52a and 52b extend toward one side (i.e., the left side in FIG. 1) in the X direction respectively from opposite end portions of the separation wall 51 of the frame 5 in a Y direction that is perpendicular to both the X and Z directions. The third part 52c extends in the Y direction to connect the first and second parts 52a and 52b. Similarly, the capacitor-surrounding wall 53 of the frame 5 includes first, second and third parts 53a, 53b and 53c. The first and second parts 53a and 53b extend toward the other side (i.e., the right side in FIG. 1) in the X direction respectively from the opposite end portions of the separation wall 51 of the frame 5 in the Y direction. The third part 53c extends in the Y direction to connect the first and second parts 53a and 53b.

Further, as shown in FIG. 3, the capacitor-surrounding wall 53 has a smaller length in the Z direction than the stacked body-surrounding wall 52. Moreover, as shown in FIG. 1, the capacitor-surrounding wall 53 is thinner than the stacked body-surrounding wall 52.

As described previously, the stacked body 10 is formed by stacking the semiconductor modules 2 alternately with the cooling devices 3 in the X direction. In the present embodiment, each of the cooling devices 3 is implemented by one cooling pipe that has formed therein a coolant passage 300 through which a coolant 16 flows.

The capacitor 4 is arranged adjacent to the stacked body 10 in the X direction. Between the capacitor 4 and the stacked body 10, there is formed the separation wall 51 of the frame 5 to separate them from each other in the X direction. Moreover, a pressing member (e.g., a leaf spring) 17 is interposed between the separation wall 51 and the stacked body 10 to press the stacked body 10 against the third part 52c of the stacked body-surrounding wall 52. Consequently, with the pressing force of the pressing member 17, it becomes possible to fix the stacked body 10 in the frame 5 while securing sufficient contact pressure between the semiconductor modules 2 and the cooling devices 3.

At opposite ends of the stacked body 10 in the Y direction, there are respectively arranged a pair of connecting pipes 18 to fluidically connect each adjacent pair of the cooling devices 3 in the X direction. Moreover, both an inlet pipe 14 and an outlet pipe 15 are mounted to the one (i.e., 3a) of the cooling devices 3 which is located furthest from the pressing member 17. In operation, the coolant 16 is introduced into the cooling device 3a via the inlet pipe 14, distributed by the connecting pipes 18 to flow through each of the cooling passages 300 formed in the cooling devices 3, and discharged out of the cooling device 3a via the outlet pipe 15. Consequently, all the semiconductor modules 2 are cooled by the coolant 16 flowing through the cooling passages 300 formed in the cooling devices 3.

As shown in FIGS. 1 and 3, each of the first and second parts 53a and 53b of the capacitor-surrounding wall 53 has a boss 530 which has a female-threaded bore formed therein. On the other hand, the capacitor 4 has a pair of protrusions 410 that protrude in the Y direction respectively from opposite side surfaces of the capacitor 4. Each of the protrusions 410 has a through-hole 415 formed therein (see FIG. 6). In assembling the capacitor 4 to the frame 5, the capacitor 4 is first placed in the frame 5 so that each of the through-holes 415 of the protrusions 410 of the capacitor 4 is brought into alignment with one of the female-threaded bores formed in the bosses 530 of the first and second parts 53a and 53b of the capacitor-surrounding wall 53. Then, for each aligned pair of the through-holes 415 of the protrusions 410 of the capacitor 4 and the female-threaded bores formed in the bosses 530 of the first and second parts 53a and 53b of the capacitor-surrounding wall 53, a bolt 411 is passed through the through-hole 415 of the protrusion 410 and fastened into the female-threaded bore formed in the boss 530. Consequently, the capacitor 4 is fixed to the frame 5.

The frame 5 is received in the case 6 together with the stacked body 10 and the capacitor 4. As shown in FIGS. 1 and 2, the case 6 has a frame-surrounding wall 60 and a plurality (e.g., four) of bosses 69. The frame-surrounding wall 60 surrounds the frame 5 so that on a cross section of the electric power conversion apparatus 1 perpendicular to the Z direction, the frame 5 is enclosed by the frame-surrounding wall 60. The bosses 69 are formed on the inner surface of the frame-surrounding wall 60 so as to protrude inward from the frame-surrounding wall 60. Each of the bosses 69 has a female-threaded bore formed therein. On the other hand, the frame 5 has a plurality (e.g., four) of protrusions 59 formed on the outer surfaces of the stacked body-surrounding wall 52 and the capacitor-surrounding wall 53 so as to protrude outward from those walls 52 and 53. Each of the protrusions 59 has a through-hole formed therein. In assembling the frame 5 to the case 6, the frame 5 is placed in the case 6 so that each of the through-holes of the protrusions 59 of the frame 5 is brought into alignment with one of the female-threaded bores of the bosses 69 of the case 6. Then, for each aligned pair of the through-holes of the protrusions 59 of the frame 5 and the female-threaded bores of the bosses 69 of the case 6, a bolt 68 is passed through the through-hole of the protrusion 59 and fastened into the female-threaded bore of the boss 69. Consequently, the frame 5 is fixed to the case 6.

As shown in FIG. 1, the frame-surrounding wall 60 of the case 6 and the capacitor-surrounding wall 53 of the frame 5 are separated from each other with a first air gap A1 formed therebetween. Moreover, the capacitor-surrounding wall 53 of the frame 5 and the capacitor 4 are also separated from each other with a second air gap A2 formed therebetween. In addition, the capacitor 4 abuts the separation wall 51 of the frame 5.

As shown in FIG. 3, two portions 65 and 66 of the frame-surrounding wall 60 of the case 6 which respectively face the end portions 42 and 43 of the capacitor 4 are recessed toward the capacitor 4 (or recessed inward) from a portion 67 of the frame-surrounding wall 60 which faces the capacitor-surrounding wall 53 of the frame 5.

As shown in FIG. 2, each of the semiconductor modules 2 includes the main body 21, which has the semiconductor elements 20 (shown in FIG. 4) sealed therein, the control terminals 22 that protrude from the main body 21 toward one side in the Z direction (i.e., upward in FIG. 2), and a pair of power terminals 23 that protrude from the main body 21 toward the other side in the Z direction (i.e., downward in FIG. 2). Further, the control terminals 22 are electrically connected to a control circuit board 7 that is arranged in the case 6 above the stacked body 10 and configured to control the switching operation of the semiconductor modules 2. On the other hand, the power terminals 23 are connected to a bus bar which is not shown in the drawings.

As shown in FIG. 3, the control circuit board 7 is arranged with its longitudinal direction coinciding with the X direction. Moreover, the control circuit board 7 extends in the X direction so as to cover both the stacked body 10 and the capacitor 4. Consequently, the control circuit board 7 and the capacitor 4 overlap each other in the Z direction.

In the present embodiment, the number of the semiconductor modules 2 included in the stacked body 10 is small (e.g., equal to six); thus, the length of the stacked body 10 in the X direction is short. Consequently, even with the capacitor 4 arranged adjacent to the stacked body 10 in the X direction, the length of the entire electric power conversion apparatus 1 in the X direction is prevented from becoming too long.

The control circuit board 7 includes a high-voltage section 71 and a low-voltage section 72 that are adjacent to each other in the X direction. The high-voltage section 71 is connected to the control terminals 22 of the semiconductor modules 2 and operates with a relatively high voltage applied thereto. On the other hand, the low-voltage section 72 operates with a relatively low voltage applied thereto for performing the switching control. Moreover, the control circuit board 7 is arranged so that the low-voltage section 72 overlaps the capacitor 4 in the Z direction.

Figure 4:
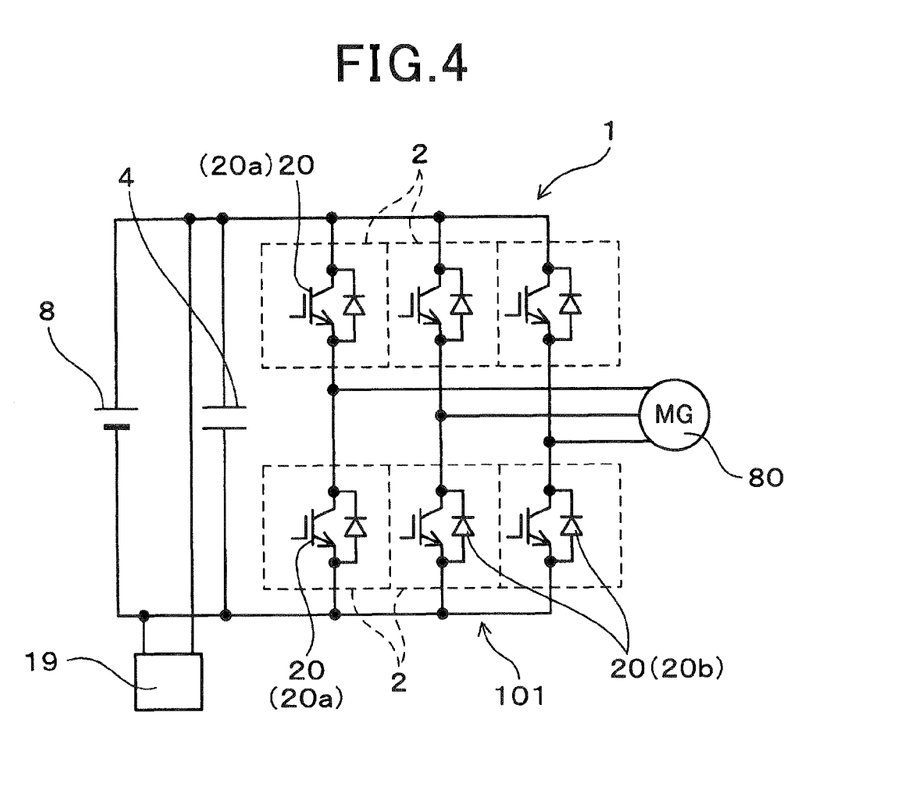
FIG. 4 is a schematic circuit diagram of the electric power conversion apparatus.

As shown in FIG. 4, each of the semiconductor modules 2 includes, as the semiconductor elements 20, a switching element 20a and a freewheeling diode 20b. The switching element 20a may be implemented by, for example, an IGBT (Insulated Gate Bipolar Transistor). The freewheeling diode 20b is connected in reverse direction in parallel with the switching element 20a. In the present embodiment, the six semiconductor modules 2 included in the stacked body 10 are electrically connected to together form an inverter circuit 101. In operation, the DC voltage supplied from a DC power supply 8 is converted into a three-phase AC voltage by the inverter circuit 101. The obtained three-phase AC voltage is then supplied to a three-phase AC motor 80 to drive it.

The capacitor 4 is electrically connected in parallel with the inverter circuit 101 to smooth the DC voltage applied to the semiconductor modules 2. In addition, a DC-to-DC converter 19 is electrically connected in parallel with the capacitor 4 to convert the DC voltage supplied from the DC power supply 8 into a low DC voltage. The obtained low DC voltage is then supplied to a low-voltage battery (not shown) to charge it.

Figure 5:
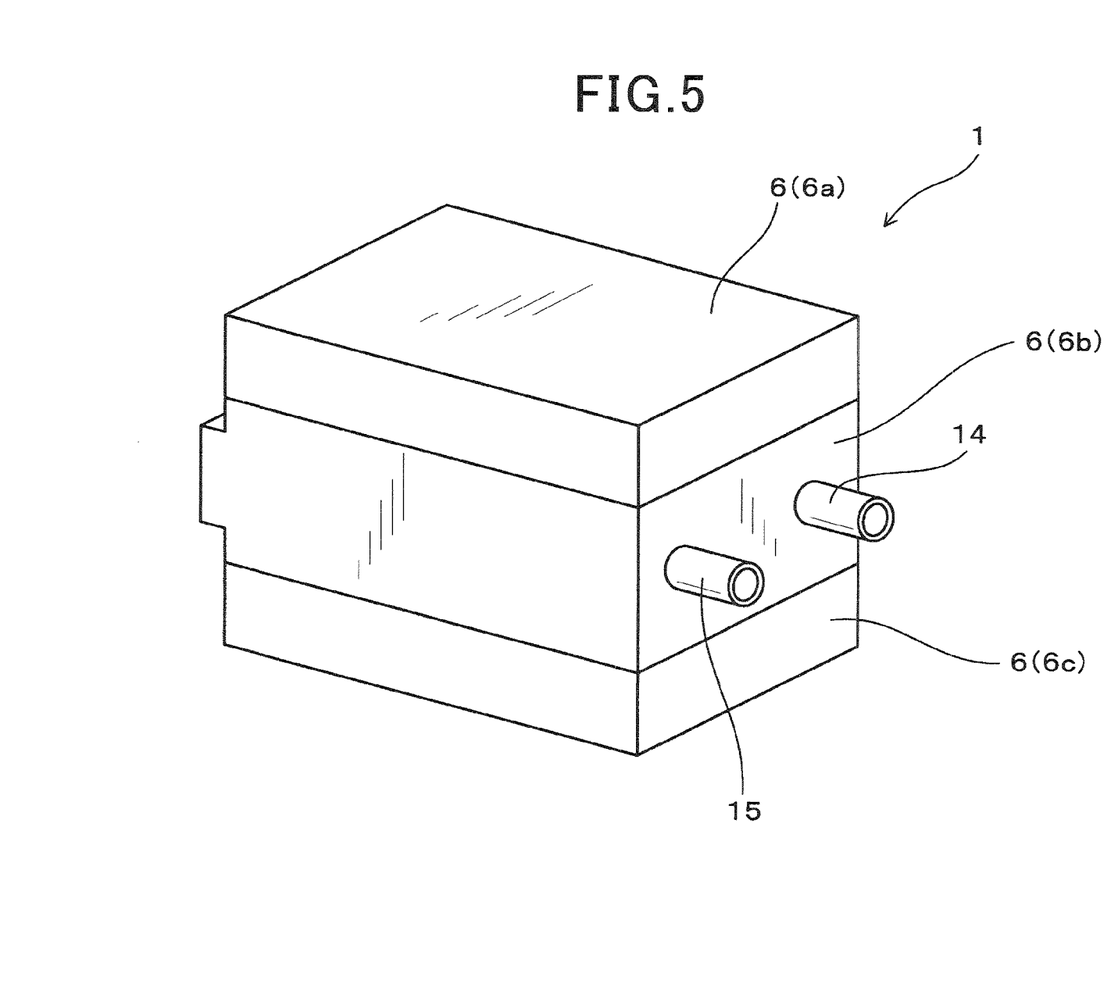
FIG. 5 is a perspective view of the electric power conversion apparatus.

In present embodiment, as shown in FIG. 5, the case 6 is configured to include first, second and third parts 6a, 6b and 6c that are assembled together. The first part 6a receives the control circuit board 7 therein. The second part 6b receives all of the frame 5, the stacked body 10 and the capacitor 4 therein. The third part 6c receives the DC-to-DC converter 19 therein.

Figure 6:
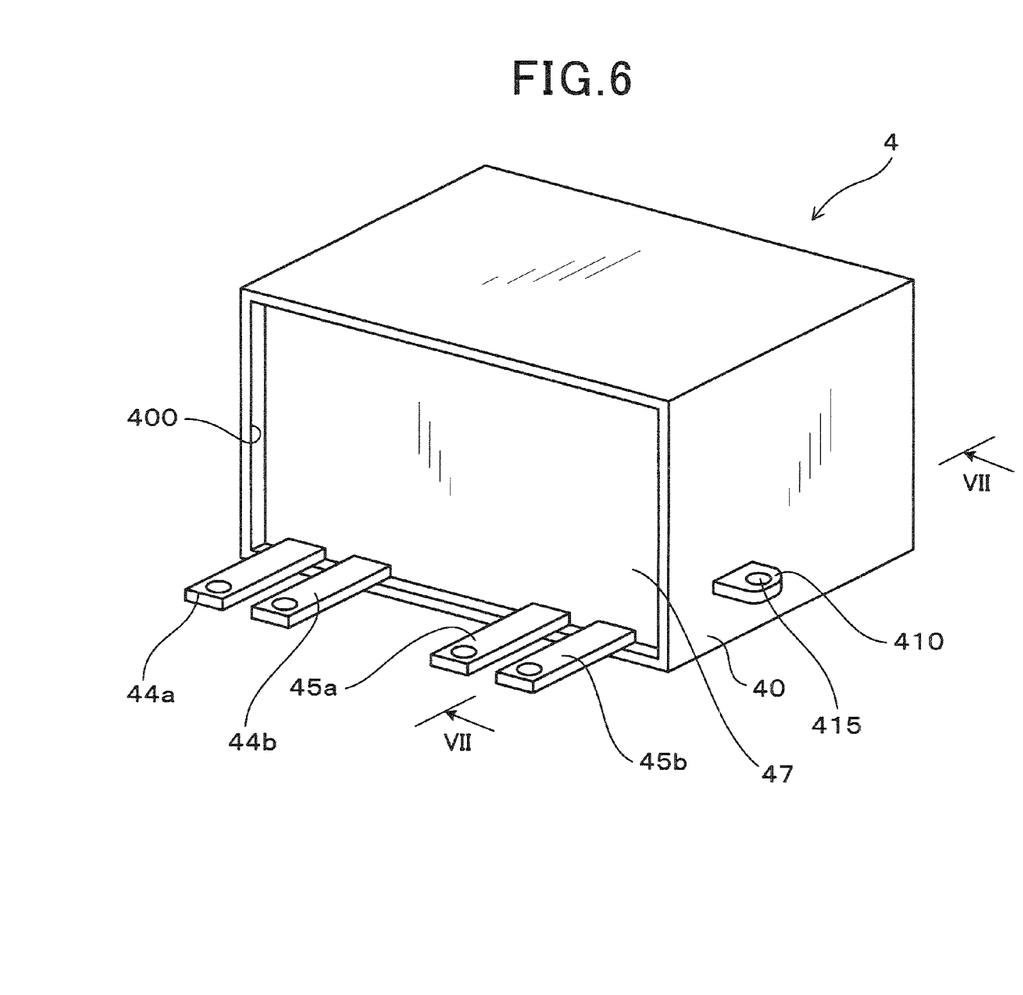
FIG. 6 is a perspective view of a capacitor of the electric power conversion apparatus.
Figure 7:
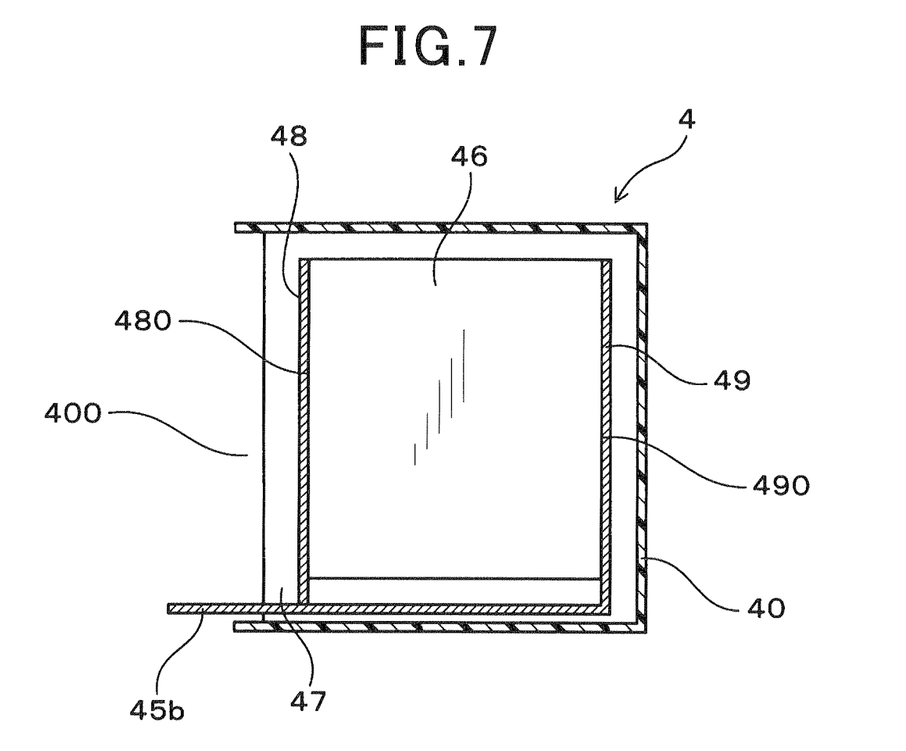
FIG. 7 is a cross-sectional view of the capacitor taken along the line VII-VII in FIG. 6.

Moreover, in the present embodiment, as shown in FIGS. 6 and 7, the capacitor 4 is configured to include a capacitor case 40, a capacitor element 46 received in the capacitor case 40, and a sealing member 47 for sealing the capacitor element 46 inside the capacitor case 40. The capacitor element 46 may be implemented by, for example, a film capacitor element. The capacitor element 46 has a positive electrode 48 and a negative electrode 49 respectively fixed to opposite end surfaces 480 and 490 thereof. Further, both a positive input terminal 44a and a positive output terminal 45a extend from the positive electrode 48 and protrude outside of the capacitor case 40 via an opening 400 formed in the capacitor case 40. Similarly, both a negative input terminal 44b and a negative output terminal 45b extend from the negative electrode 49 and protrude outside of the capacitor case 40 via the opening 400.

In addition, both the positive and negative input terminals 44a and 44b are electrically connected to the DC power supply 8 (see FIG. 4) via a bus bar (not shown). Similarly, both the positive and negative output terminals 45a and 45b are electrically connected to the power terminals 23 (shown in FIG. 3) of the semiconductor modules 2 via another bus bar (not shown).

According to the present embodiment, it is possible to achieve the following advantageous effects.

As described above, in the present embodiment, the electric power conversion apparatus 1 includes the stacked body 10, the capacitor 4, the metal frame 5 and the case 6. The stacked body 10 is formed by stacking the semiconductor modules 2 and has the coolant passages 300 formed between the semiconductor modules 2. Each of the semiconductor modules 2 includes the main body 21, which has the semiconductor elements 20 built therein, and the control terminals 22 that protrude from the main body 21 in the Z direction. The capacitor 4 is configured to smooth the DC voltage applied to the semiconductor modules 2. The frame 5 has both the stacked body 10 and the capacitor 4 fixed therein. The case 6 has all of the stacked body 10, the capacitor 4 and the frame 5 received therein. Further, in the present embodiment, the frame has the separation wall 51, and the stacked body-surrounding wall 52 and the capacitor-surrounding wall 53 both of which are connected with the separation wall 51. The separation wall 51 separates the stacked body 10 from the capacitor 4. The stacked body-surrounding wall 52 surrounds the stacked body 10 with the help of the separation wall 51 so that on the cross section of the electric power conversion apparatus 1 perpendicular to the Z direction as shown in FIG. 1, the stacked body 10 is enclosed by the stacked-body surrounding wall 52 and the separation wall 51. The capacitor-surrounding wall 53 surrounds the capacitor 4 with the help of the separation wall 51 so that on the cross section of the electric power conversion apparatus 1 perpendicular to the Z direction, the capacitor 4 is enclosed by the capacitor-surrounding wall 53 and the separation wall 51. The capacitor 4 has the pair of end portions 42 and 43 that are opposite to each other in the Z direction and each completely exposed from the capacitor-surrounding wall 53 of the frame 5.

With the above configuration, the frame 5 has the capacitor-surrounding wall 53 surrounding the capacitor 4. Consequently, with the capacitor-surrounding wall 53, it is possible to block external heat which otherwise would be transmitted to the capacitor 4 via the case 6. As a result, it is possible to suppress increase in the temperature of the capacitor 4, thereby extending the service life of the capacitor 4.

Further, with the above configuration, the frame 5 also has the stacked body-surrounding wall 52 surrounding the stacked body 10 which has the coolant passages 300 formed therein. Consequently, the frame 5 and thus the capacitor-surrounding wall 53 of the frame 5 can be cooled by the coolant 16 that flows through the coolant passages 300. As a result, with the capacitor-surrounding wall 53 being cooled by the coolant 16, it is possible to more effectively suppress increase in the temperature of the capacitor 4, thereby more reliably extending the service life of the capacitor 4.

Moreover, with the above configuration, the end portions 42 and 43 of the capacitor 4 in the Z direction are each completely exposed from the capacitor-surrounding wall 53 of the frame 5. Consequently, it becomes possible to reduce the size of the capacitor-surrounding wall 53 of the frame 5. As a result, it also becomes possible to reduce the size of the case 6 without causing interference between the capacitor-surrounding wall 53 of the frame 5 and the case 6.

More specifically, in the present embodiment, the size of the case 6 is reduced by recessing the two portions 65 and 66 of the frame-surrounding wall 60 of the case 6 toward the capacitor 4 from the portion 67 of the frame-surrounding wall 60; the two portions 65 and 66 of the frame-surrounding wall 60 respectively face the end portions 42 and 43 of the capacitor 4 which are exposed from the capacitor-surrounding wall 53 of the frame 5, while the portion 67 of the frame-surrounding wall 60 faces the capacitor-surrounding wall 53.

In addition, if the capacitor-surrounding wall 53 of the frame 5 was formed so as to surround the entire capacitor 4, the size of the capacitor-surrounding wall 53 would be too large to reduce the size of the case 6 without causing interference between the capacitor-surrounding wall 53 and the case 6.

Furthermore, with the above configuration of the electric power conversion apparatus 1 according to the present embodiment, the central portion 41 of the capacitor 4 is surrounded by the capacitor-surrounding wall 53 of the frame 5. In general, it is particularly easy for the temperature of the capacitor 4 to be increased at the central portion 41 by heat generated by the capacitor 4 itself during operation. However, by surrounding the central portion 41 with the capacitor-surrounding wall 53 of the metal frame 5 which can be cooled by the coolant 16 flowing through the coolant passages 300 formed in the stacked body 10, it is still possible to effectively suppress increase in the temperature of the capacitor 4.

Moreover, in the present embodiment, the case 6 has the frame-surrounding wall 60 that surrounds the frame 5 so that on the cross section of the electric power conversion apparatus 1 perpendicular to the Z direction as shown in FIG. 1, the frame 5 is enclosed by the frame-surrounding wall 60. Further, the frame-surrounding wall 60 and the capacitor-surrounding wall 53 of the frame 5 are separated from each other with the first air gap A1 formed therebetween. Moreover, the capacitor-surrounding wall 53 of the frame 5 and the capacitor 4 are also separated from each other with the second air gap A2 formed therebetween.

Consequently, with the first and second air gaps A1 and A2, when heat generated by electronic devices existing in the vicinity of the electric power conversion apparatus 1 is transmitted to the case 6, it is possible to block the heat from being further transmitted to the capacitor 4. As a result, it is possible to more reliably suppress increase in the temperature of the capacitor 4.

In the present embodiment, the electric power conversion apparatus 1 includes the pressing member 17 that presses the stacked body 10 in the X direction, in which the semiconductor modules 2 and the cooling devices 3 are stacked, thereby fixing the stacked body 10 in the frame 5. Moreover, the capacitor-surrounding wall 53 of the frame 5 has a smaller thickness than a thinnest part of the stacked body-surrounding wall 52 and separation wall 51 of the frame 5. In addition, in the present embodiment, as shown in FIG. 1, the first and second parts 52a and 52b of the stacked body-surrounding wall 52 have the same thickness as the separation wall 51, while the third part 52c of the stacked body-surrounding wall 52 has a larger thickness than the separation wall 51. Accordingly, the thinnest part of the stacked body-surrounding wall 52 and separation wall 51 of the frame 5 may be represented by any one of the first and second parts 52a and 52b of the stacked body-surrounding wall 52 and the separation wall 51.

With the above configuration, it is possible to reduce the weight and size of the frame 5, thereby making the entire electric power conversion apparatus 1 more compact in size.

More specifically, since the stacked body 10 is formed by stacking the semiconductor modules 2 and the cooling devices 3, it is necessary to fix the semiconductor modules 2 and the cooling devices 3 together by the pressing force of the pressing member 17. Accordingly, it is necessary for the stacked body-surrounding wall 52 and separation wall 51 of the frame 5 to be thick enough to withstand the pressing force of the pressing member 17. In contrast, since the capacitor 4 is formed as a one-piece part, it is unnecessary to press the capacitor 4 for the purpose of fixing the capacitor 4. Accordingly, without a pressing force applied to the capacitor-surrounding wall 53 of the frame 5 for fixing the capacitor 4, it becomes possible to set the thickness of the capacitor-surrounding wall 53 smaller than those of the stacked body-surrounding wall 52 and the separation wall 51, thereby reducing the weight and size of the frame 5. Consequently, it becomes possible to further reduce the size of the case 6.

In the present embodiment, the capacitor-surrounding wall 53 of the frame 5 has a smaller length in the Z direction, in which the control terminals 22 of the semiconductor modules 2 protrude, than a longest part of the stacked body-surrounding wall 52 and separation wall 51 of the frame 5. In addition, in the present embodiment, as shown in FIG. 3, all of the first, second and third parts 52a, 52b and 52c of the stacked body-surrounding wall 52 have the same length in the Z direction as the separation wall 51. Accordingly, the longest part of the stacked body-surrounding wall 52 and separation wall 51 of the frame 5 may be represented by any one of the first, second and third parts 52a, 52b and 52c of the stacked body-surrounding wall 52 and the separation wall 51.

With the above configuration, it becomes possible to further reduce the weight and size of the frame 5 by reducing the length of the capacitor-surrounding wall 53 in the Z direction as well as the thickness of the capacitor-surrounding wall 53. Consequently, it becomes possible to further reduce the size of the case 6.

To sum up, according to the present embodiment, it becomes possible to make the electric power conversion apparatus 1 compact in size while effectively suppressing increase in the temperature of the capacitor 4.

[Second Embodiment]

This embodiment illustrates an electric power conversion apparatus 1 which has almost the same configuration as the electric power conversion apparatus 1 according to the first embodiment; accordingly, only the differences therebetween will be described hereinafter.

In the first embodiment, the capacitor-surrounding wall 53 of the frame 5 is formed so that opposite ends of the capacitor-surrounding wall 53 in the Z direction are respectively positioned on opposite sides of the center position of the separation wall 51 of the frame 5 in the Z direction. Moreover, the capacitor 4 is fixed in the frame 5 so that the upper end surface of the capacitor 4 is positioned flush with the upper end surface of the separation wall 51 of the frame 5, and the lower end surface of the capacitor 4 is positioned lower than the lower end surface of the separation wall 51. Accordingly, the clearance provided between the control circuit board 7 and the capacitor 4 in the Z direction is equal to the clearance provided between the control circuit board 7 and the separation wall 51 of the frame 5 in the Z direction (see FIG. 3).

Figure 8:
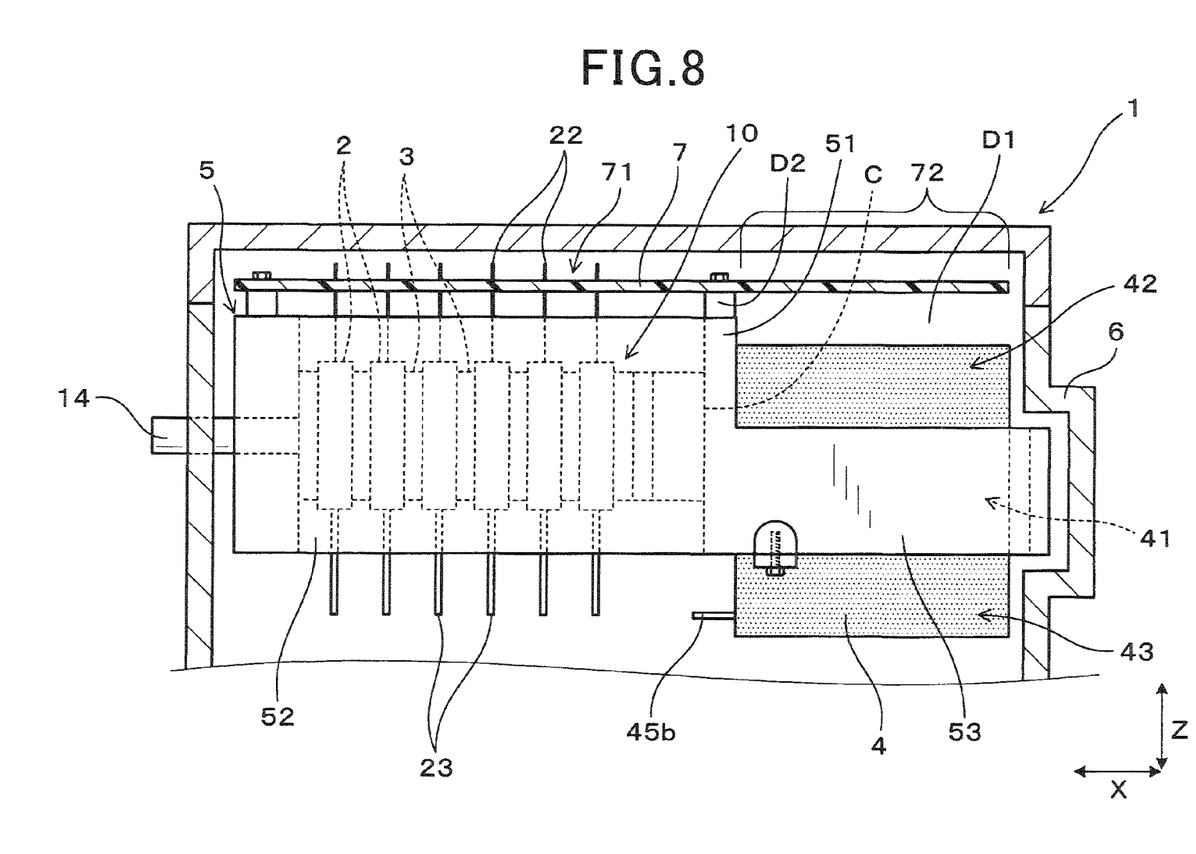
FIG. 8 is a cross-sectional view of an electric power conversion apparatus according to a second embodiment.

In comparison, in the present embodiment, as shown in FIG. 8, the capacitor-surrounding wall 53 of the frame 5 is formed so that the entire capacitor-surrounding wall 53 is positioned lower (or more away from the control circuit board 7) than the center position C of the separation wall 51 of the frame 5 in the Z direction. Moreover, the capacitor 4 is fixed in the frame 5 so that the upper and lower end surfaces of the capacitor 4 are positioned respectively lower than the upper and lower end surfaces of the separation wall 51 of the frame 5. Accordingly, the clearance D1 provided between the control circuit board 7 and the capacitor 4 in the Z direction is greater than the clearance D2 provided between the control circuit board 7 and the separation wall 51 of the frame 5 in the Z direction.

According to the present embodiment, it is possible to achieve the same advantageous effects as achievable according to the first embodiment.

Moreover, in the present embodiment, the control circuit board 7 is arranged so that the low-voltage section 72 of the control circuit board 7 overlaps the capacitor 4 in the Z direction, as in the first embodiment. The low-voltage section 72 operates on the relatively low voltage and thus could be easily influenced by electromagnetic noise emitted from the capacitor 4. However, in the present embodiment, with the clearance D1 set to be greater than the clearance D2, it becomes difficult for the low-voltage section 72 to be influenced by the electromagnetic noise emitted from the capacitor 4. As a result, malfunction of the low-voltage section 72 due to the electromagnetic noise can be reliably prevented.

[Third Embodiment]

This embodiment illustrates an electric power conversion apparatus 1 which has almost the same configuration as the electric power conversion apparatus 1 according to the first embodiment; accordingly, only the differences therebetween will be described hereinafter.

In the first embodiment, the length of the capacitor 4 in the Z direction is set so that only the lower end surface of the capacitor 4 protrudes downward from the lower end surface of the separation wall 51 of the frame 5 with the upper end surface of the capacitor 4 flush with the upper end surface of the separation wall 51. Moreover, the length of the control circuit board 7 in the X direction is set so that the control circuit board 7 covers both the stacked body 10 and the capacitor 4 (see FIG. 3).

Figure 9:
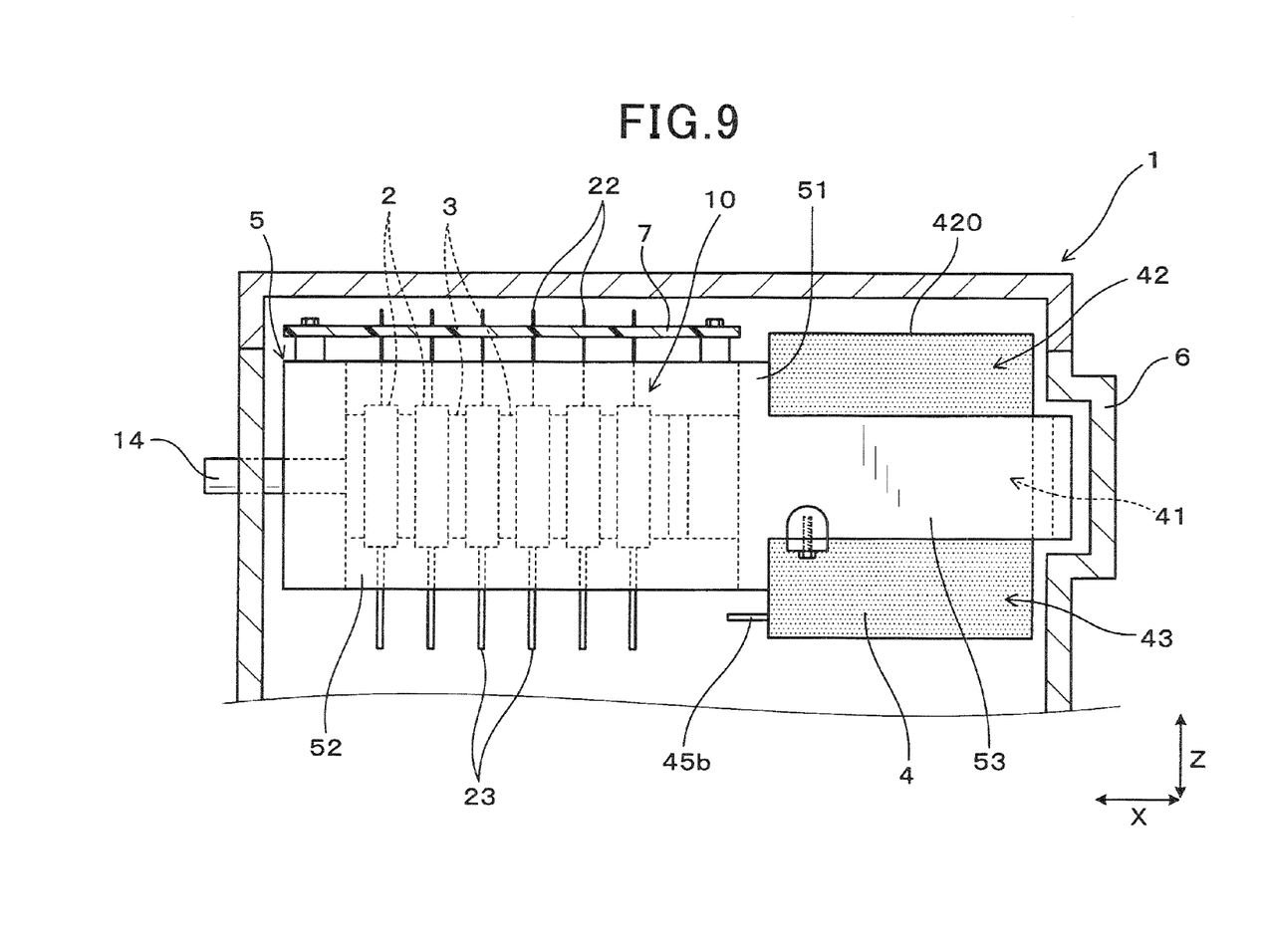
FIG. 9 is a cross-sectional view of an electric power conversion apparatus according to a third embodiment.

In comparison, in the present embodiment, as shown in FIG. 9, the length of the control circuit board 7 in the X direction is reduced so that the control circuit board 7 covers only the stacked body 10. In other words, the control circuit board 7 is arranged in the case 6 without overlapping the capacitor 4 in the Z direction in which the control terminals 22 of the semiconductor modules 2 protrude. Moreover, the length of the capacitor 4 in the Z direction is increased so that the upper end surface 420 of the capacitor 4 protrudes upward from the upper end surface of the separation wall 51 of the frame 5 and is positioned at substantially the same height as the control circuit board 7.

According to the present embodiment, it is possible to achieve the same advantageous effects as achievable according to the first embodiment.

Moreover, in the present embodiment, without covering the capacitor 4, the control circuit board 7 can be reliably prevented from being influenced by electromagnetic noise emitted from the capacitor 4. As a result, malfunction of the control circuit board 7 due to the electromagnetic noise can be reliably prevented.

[Fourth Embodiment]

This embodiment illustrates an electric power conversion apparatus 1 which has almost the same configuration as the electric power conversion apparatus 1 according to the first embodiment; accordingly, only the differences therebetween will be described hereinafter.

In the first embodiment, both the end portions 42 and 43 of the capacitor 4 in the Z direction are completely exposed from the capacitor-surrounding wall 53 of the frame 5 (see FIG. 3).

Figure 10:
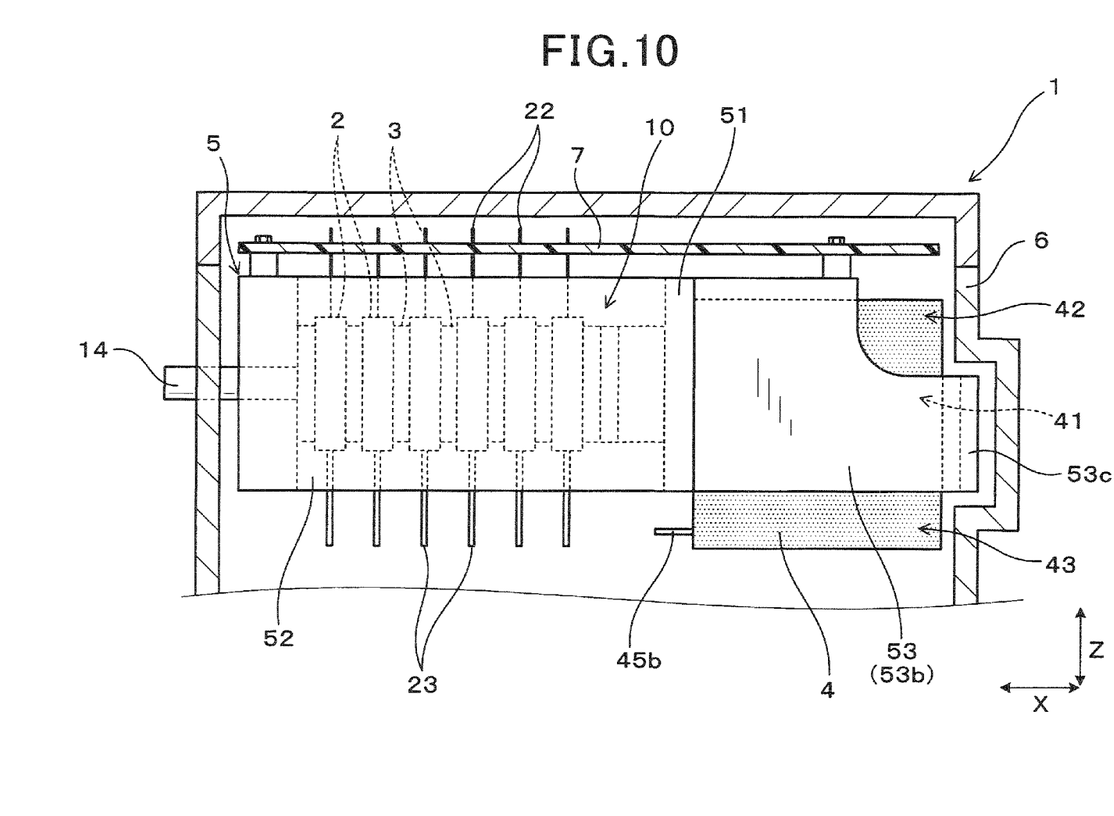
FIG. 10 is a cross-sectional view of an electric power conversion apparatus according to a fourth embodiment.

In comparison, in the present embodiment, as shown in FIG. 10, the end portion 42 of the capacitor 4 is only partially exposed from the capacitor-surrounding wall 53 of the frame 5, while the end portion 43 of the capacitor 4 is completely exposed from the capacitor-surrounding wall 53. In other words, part of the end portion 42 of the capacitor 4 is covered by the capacitor-surrounding wall 53 of the frame 5.

According to the present embodiment, it is possible to achieve the same advantageous effects as achievable according to the first embodiment.

Moreover, as described in the first embodiment, the metal frame 5 and thus the capacitor-surrounding wall 53 of the frame 5 can be cooled by the coolant 16 that flows through the coolant passages 300 formed in the stacked body 10. Accordingly, in the present embodiment, with part of the end portion 42 of the capacitor 4 covered by the capacitor-surrounding wall 53 of the frame 5, it is possible to improve the effect of cooling the capacitor 4 via the capacitor-surrounding wall 53.

While the above particular embodiments have been shown and described, it will be understood by those skilled in the art that various modifications, changes, and improvements may be made without departing from the spirit of the invention.

For example, in the first embodiment, the entire capacitor-surrounding wall 53 of the frame 5 has a smaller thickness than the thickness of the thinnest part of the stacked body-surrounding wall 52 and separation wall 51 of the frame 5 (see FIG. 1). However, the capacitor-surrounding wall 53 of the frame 5 may also be formed so that only part of the capacitor-surrounding wall 53 has a smaller thickness than the thinnest part of the stacked body-surrounding wall 52 and separation wall 51 of the frame 5.

In addition, in the first embodiment, the first and second parts 52a and 52b of the stacked body-surrounding wall 52 have the same thickness as the separation wall 51 (see FIG. 1). However, the first and second parts 52a and 52b of the stacked body-surrounding wall 52 may also have a different thickness from the separation wall 51.

In any cases, it is preferable that at least part of the capacitor-surrounding wall 53 of the frame 5 has a smaller thickness than a thinnest part of the stacked body-surrounding wall 52 and separation wall 51 of the frame 5.

In the first embodiment, the entire capacitor-surrounding wall 53 of the frame 5 has a smaller length in the Z direction, in which the control terminals 22 of the semiconductor modules 2 protrude, than the longest part of the stacked body-surrounding wall 52 and separation wall 51 of the frame 5 (see FIG. 3). However, the capacitor-surrounding wall 53 of the frame 5 may also be formed so that only part of the capacitor-surrounding wall 53 has a smaller length in the Z direction than the longest part of the stacked body-surrounding wall 52 and separation wall 51 of the frame 5

In addition, in the first embodiment, all of the first, second and third parts 52a, 52b and 52c of the stacked body-surrounding wall 52 have the same length in the Z direction as the separation wall 51 (see FIG. 3). However, the first, second and third parts 52a, 52b and 52c of the stacked body-surrounding wall 52 may also have a different length in the Z direction from the separation wall 51.

In any cases, it is preferable that the at least part of the capacitor-surrounding wall 53 of the frame 5, which has the smaller thickness than the thinnest part of the stacked body-surrounding wall 52 and separation wall 51 of the frame 5, has a smaller length in the Z direction than a longest part of the stacked body-surrounding wall 52 and separation wall 51 of the frame 5.

In the first embodiment, the pressing member 17 is interposed between the separation wall 51 of the frame 5 and the stacked body 10 to press the stacked body 10 against the third part 52c of the stacked body-surrounding wall 52 of the frame 5. However, the pressing member 17 may also be interposed between the third part 52c of the stacked body-surrounding wall 52 and the stacked body 10 to press the stacked body 10 against the separation wall 51.

In the first embodiment, the stacked body 10 is formed by stacking the semiconductor modules 2 alternately with the cooling devices 3 in the X direction. Each of the cooling devices 3 is implemented by one cooling pipe that has formed therein the coolant passage 300 through which the coolant 16 flows (see FIG. 1). However, the stacked body 10 may also be formed by stacking only the semiconductor modules 2 and have a plurality of coolant passages 300 formed between the semiconductor modules 2 so that a coolant 16 flowing through the coolant passages 300 can make direct contact with the semiconductor modules 2.

In the first embodiment, both the end portions 42 and 43 of the capacitor 4 in the Z direction are completely exposed from the capacitor-surrounding wall 53 of the frame 5 (see FIG. 3).

In the fourth embodiment, the end portion 42 of the capacitor 4 is only partially exposed from the capacitor-surrounding wall 53 of the frame 5, while the end portion 43 of the capacitor 4 is completely exposed from the capacitor-surrounding wall 53 (see FIG. 10). However, the frame 5 may also be formed so that both the end portions 42 and 43 of the capacitor 4 are only partially exposed from the capacitor-surrounding wall 53 of the frame 5.

What is claimed is:

1. An electric power conversion apparatus comprising:
a stacked body that is formed by stacking a plurality of semiconductor modules and has a plurality of coolant passages formed between the semiconductor modules, each of the semiconductor modules including a main body, which has semiconductor elements built therein, and control terminals that protrude from the main body in a predetermined direction;
a capacitor configured to smooth DC voltage applied to the semiconductor modules;
a metal frame that has both the stacked body and the capacitor fixed therein; and
a case that has all of the stacked body, the capacitor and the frame received therein,
wherein
the frame has a separation wall, and a stacked body-surrounding wall and a capacitor-surrounding wall both of which are connected with the separation wall,
the separation wall separates the stacked body from the capacitor,
the stacked body-surrounding wall surrounds, together with the separation wall, the stacked body so that on a cross section of the electric power conversion apparatus perpendicular to the predetermined direction, in which the control terminals of the semiconductor modules protrude, the stacked body is enclosed by the stacked-body surrounding wall and the separation wall,
the capacitor-surrounding wall surrounds, together with the separation wall, the capacitor so that on the cross section of the electric power conversion apparatus perpendicular to the predetermined direction, the capacitor is enclosed by the capacitor-surrounding wall and the separation wall, and
the capacitor has a pair of end portions that are opposite to each other in the predetermined direction and each at least partially exposed from the capacitor-surrounding wall of the frame.

2. The electric power conversion apparatus as set forth in claim 1, wherein the case has a frame-surrounding wall that surrounds the frame so that on the cross section of the electric power conversion apparatus perpendicular to the predetermined direction, the frame is enclosed by the frame-surrounding wall,
the frame-surrounding wall of the case and the capacitor-surrounding wall of the frame are separated from each other with a first air gap formed therebetween, and
the capacitor-surrounding wall of the frame and the capacitor are also separated from each other with a second air gap formed therebetween.

3. The electric power conversion apparatus as set forth in claim 1, further comprising a pressing member that presses the stacked body in a stacking direction, in which the semiconductor modules are stacked, thereby fixing the stacked body in the frame, wherein at least part of the capacitor-surrounding wall of the frame has a smaller thickness than a thinnest part of the stacked body-surrounding wall and separation wall of the frame.

4. The electric power conversion apparatus as set forth in claim 3, wherein the at least part of the capacitor-surrounding wall of the frame has a smaller length in the predetermined direction, in which the control terminals of the semiconductor modules protrude, than a longest part of the stacked body-surrounding wall and separation wall of the frame.

5. The electric power conversion apparatus as set forth in claim 1, wherein the control terminals of the semiconductor modules are electrically connected to a control circuit board that is configured to control switching operation of the semiconductor modules,
the control circuit board is arranged in the case so that the control circuit board and the capacitor overlap each other in the predetermined direction in which the control terminals of the semiconductor modules protrude,
a first clearance is provided between the control circuit board and the capacitor in the predetermined direction, and a second clearance is provided between the control circuit board and the separation wall of the frame in the predetermined direction, and
the first clearance is greater than the second clearance.

6. The electric power conversion apparatus as set forth in claim 1, wherein the control terminals of the semiconductor modules are electrically connected to a control circuit board that is configured to control switching operation of the semiconductor modules, and
the control circuit board is arranged in the case without overlapping the capacitor in the predetermined direction in which the control terminals of the semiconductor modules protrude.

* * * * *